US008823414B2

(12) United States Patent
Thirugnanam et al.

(10) Patent No.: US 8,823,414 B2
(45) Date of Patent: Sep. 2, 2014

(54) MULTIPLE SIGNAL FORMAT OUTPUT DRIVER WITH CONFIGURABLE INTERNAL LOAD

(75) Inventors: Rajesh Thirugnanam, Medford, MA (US); Srisai Rao Seethamraju, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 113 days.

(21) Appl. No.: 13/470,055

(22) Filed: May 11, 2012

(65) Prior Publication Data

US 2013/0300455 A1 Nov. 14, 2013

(51) Int. Cl.
*H03K 19/0175* (2006.01)

(52) U.S. Cl.
USPC ............... 326/82; 326/30; 326/86; 326/127; 327/108

(58) Field of Classification Search
None
See application file for complete search history.

(56) References Cited

U.S. PATENT DOCUMENTS

| | | | | |
|---|---|---|---|---|
| 5,374,861 | A * | 12/1994 | Kubista | 326/30 |
| 6,433,579 | B1 * | 8/2002 | Wang et al. | 326/38 |
| 6,856,178 | B1 * | 2/2005 | Narayan | 327/108 |
| 6,924,659 | B1 * | 8/2005 | Andrews et al. | 326/30 |
| 6,943,588 | B1 * | 9/2005 | Luo et al. | 326/86 |
| 6,975,135 | B1 * | 12/2005 | Bui | 326/29 |
| 7,145,359 | B2 | 12/2006 | Hein et al. | |
| 7,352,207 | B2 | 4/2008 | Garlapati et al. | |
| 7,397,270 | B1 * | 7/2008 | Luo et al. | 326/32 |
| 7,417,460 | B2 * | 8/2008 | De Laurentiis et al. | 326/82 |
| 7,999,523 | B1 * | 8/2011 | Caffee et al. | 323/271 |
| 8,065,570 | B1 * | 11/2011 | Simmons et al. | 714/712 |
| 8,145,812 | B1 * | 3/2012 | Kavaiya et al. | 710/62 |
| 8,174,294 | B1 * | 5/2012 | Ding et al. | 327/108 |
| 8,587,339 | B2 * | 11/2013 | Johnson | 326/82 |

OTHER PUBLICATIONS

Texas Instruments, Application Report SLLA120—Interfacing Between LVPECL, VML, CML, and LVDS Levels, Dec. 2002.*
Silicon Labs AN409 Data Sheet Output Termination Options for the Si500S and Si500D Silicon Oscillators, Rev. 0.2 May 2010, pp. 1-6.
Silicon Labs Si5330 Data Sheet "1.8/2.5/3.3 V Low Jitter, Low Skew Clock Buffer/Level Translator," Rev. 0.35 May 2010, pp. 1-20.
Silicon Labs AN408 Data Sheet "Termination Options for Any-Frequency Any-Output Clock Generators and Clock Buffers," Rev. 0.4 Nov. 2010, pp. 1-16.

* cited by examiner

*Primary Examiner* — Alexander H Taningco
*Assistant Examiner* — Nelson Correa
(74) *Attorney, Agent, or Firm* — Abel Law Group, LLP

(57) ABSTRACT

A multiple signal format output driver is configurable to provide a current-mode logic (CML) output signal in response to a CML value of one or more first values of the control signal. The output driver is configurable to provide a low-power, low-voltage positive emitter-coupled logic (low-power LVPECL) output signal in response to a low-power LVPECL value of the one or more first values of the control signal. The output driver is configurable to provide a low-voltage differential signaling (LVDS) output signal in response to an LVDS value of the one or more first values of the control signal. The output driver may be configurable to provide a LVPECL output signal in response to a second value of the control signal. The output driver may be configurable to provide a high-speed current steering logic (HCSL) output in response to a third value of the control signal.

22 Claims, 11 Drawing Sheets

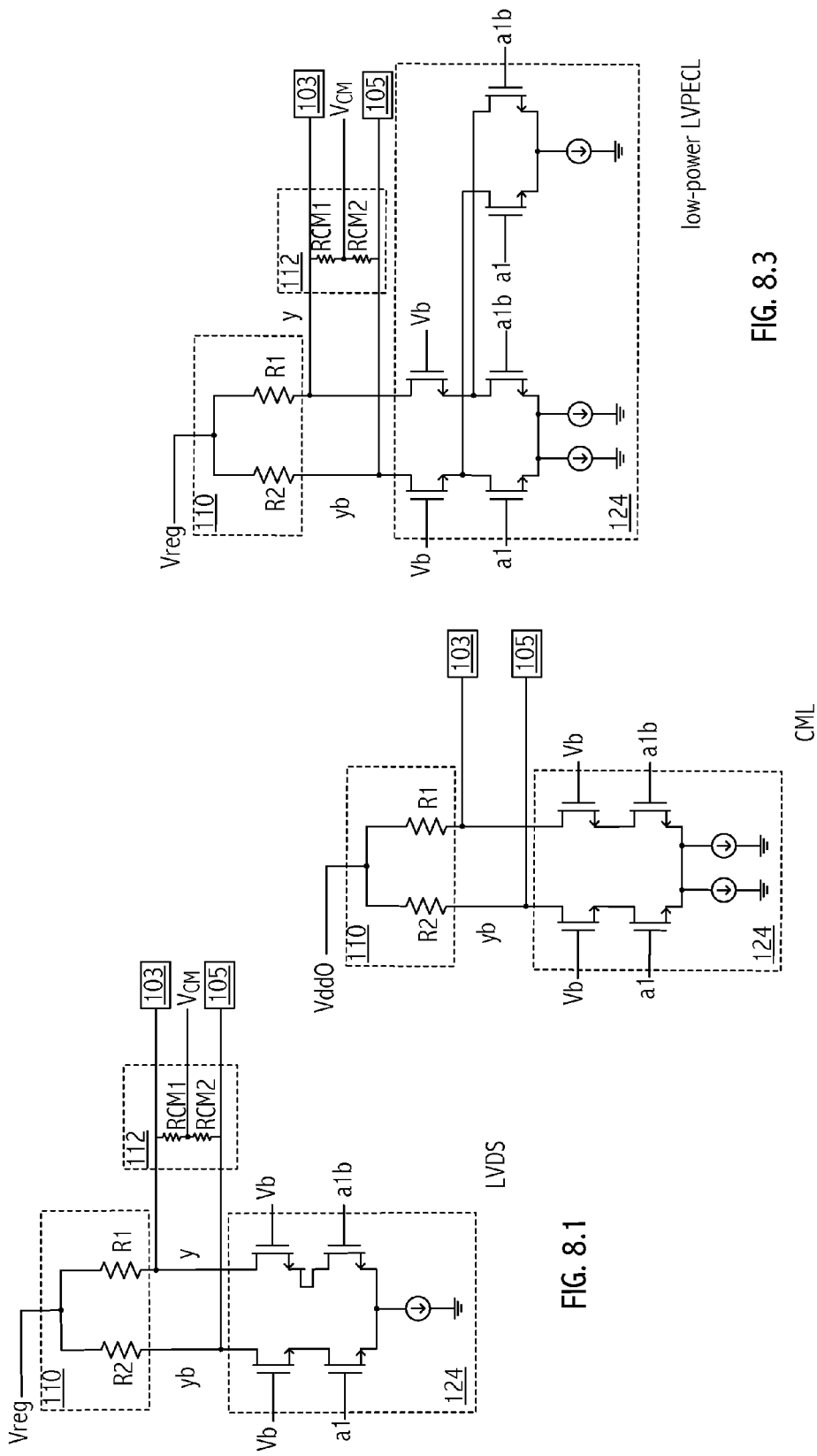

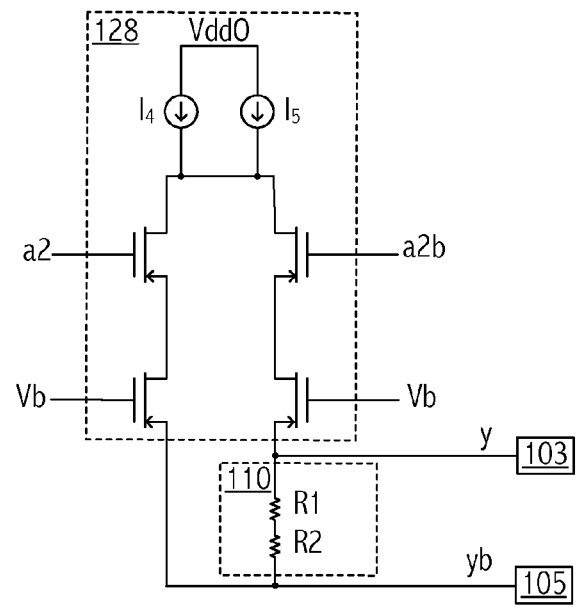
LVPECL
FIG. 8.4
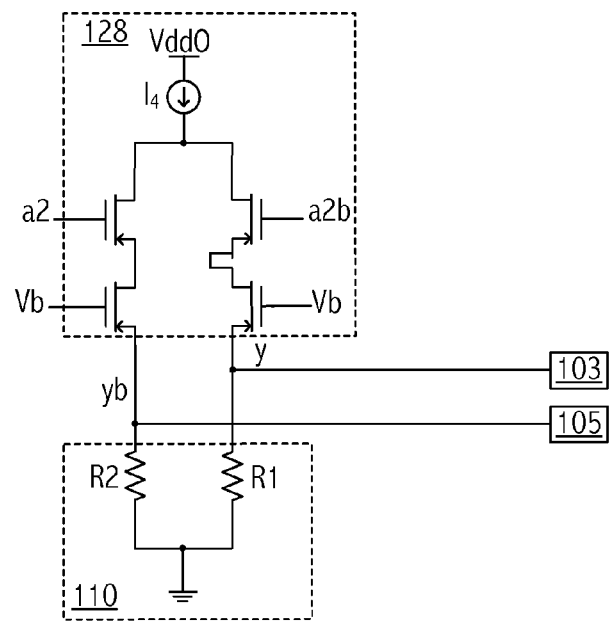
HCSL
FIG. 8.5

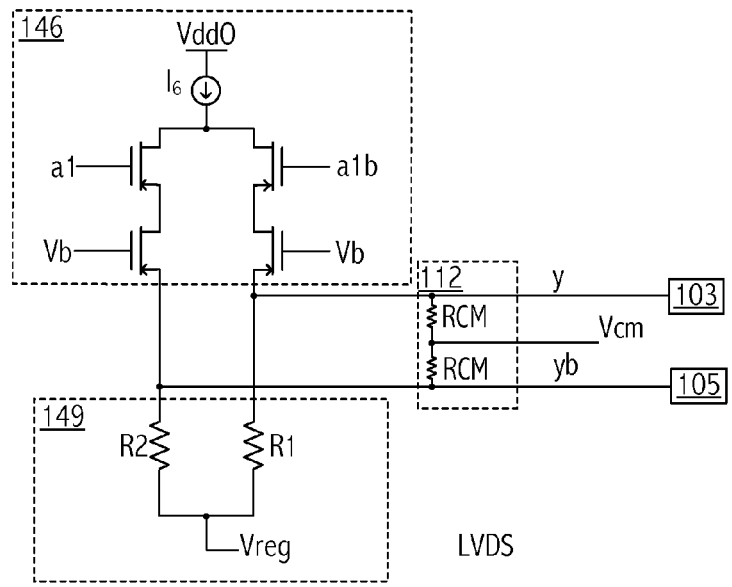
FIG. 13.1
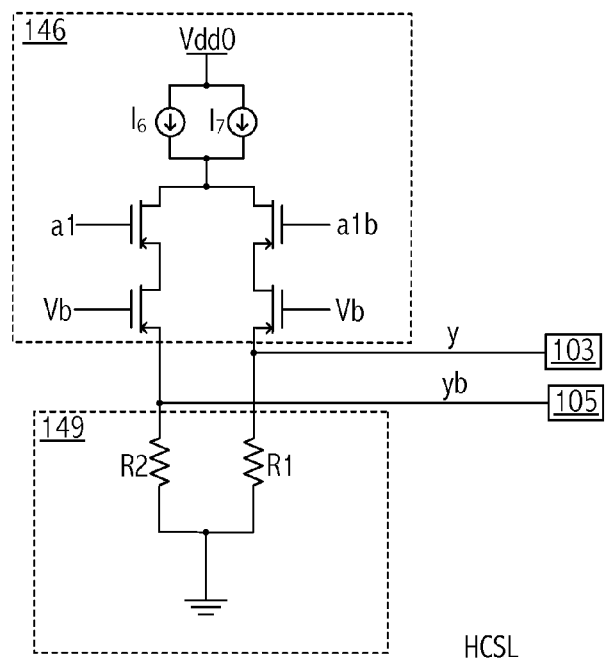
FIG. 13.2

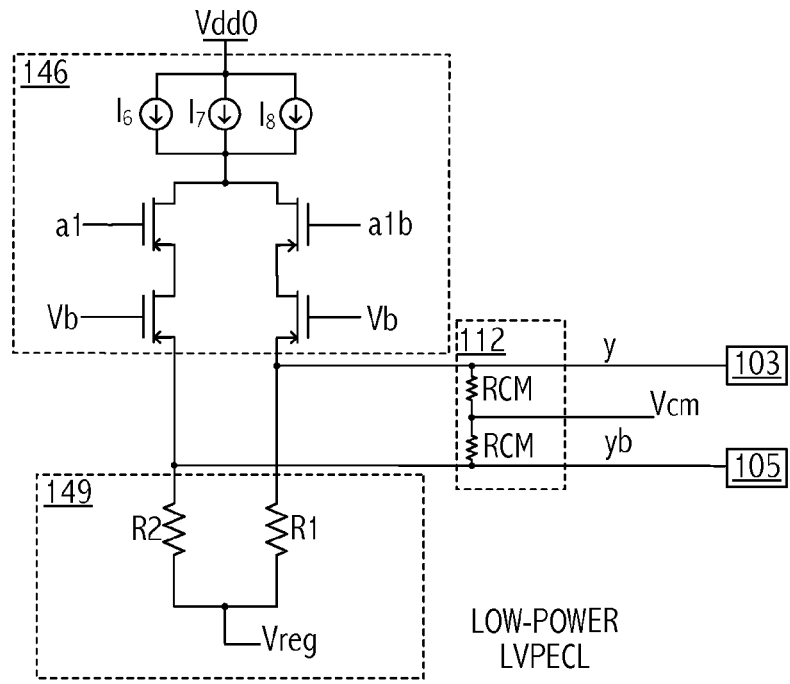
FIG. 13.3
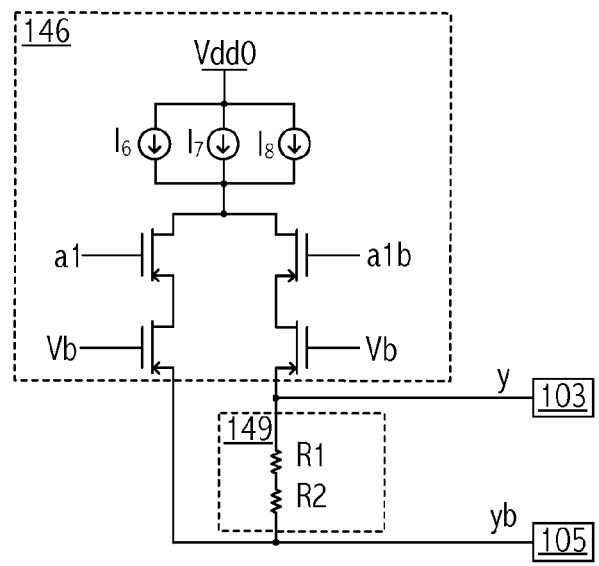
FIG. 13.4

MULTIPLE SIGNAL FORMAT OUTPUT DRIVER WITH CONFIGURABLE INTERNAL LOAD

BACKGROUND

1. Field of the Invention

The present invention relates to integrated circuits, and more particularly to output circuits of integrated circuits.

2. Description of the Related Art

An integrated circuit may provide an output signal having a selected signal format by including duplicate output bond pads. Each bond pad (or pair of pads for differential formats) is coupled to a corresponding output driver circuit. During a packaging process, the desired pads are bonded to package pins and the unconnected pads and driver are unused. While this approach allows one integrated circuit to generate multiple signal formats, extra area is consumed by the unused output driver and pads, and the output signal format must be selected and fixed during the packaging process.

Another technique for providing an output signal having a selected signal format includes designing separate integrated circuits for each output signal format to avoid wasting die area of unused output drivers(s). This approach introduces additional mask costs if the designs are processed using separate mask sets. Like the former technique, the signal format must be selected during the packaging process. Both of the former and latter techniques require additional product inventory because stock must be kept for each part number.

Conversion buffers may be used to provide an interface between input buffers and output drivers having different signal formats. This approach allows one integrated circuit to be used in multiple applications requiring different numbers and types of loads. However, conversion buffers introduce the costs of additional board space and additional clock jitter. For high precision applications, the buffer jitter can significantly degrade system performance.

Accordingly, improved techniques for providing output signals having a selected output signal format are desired.

SUMMARY OF EMBODIMENTS OF THE INVENTION

In at least one embodiment of the invention, an integrated circuit includes a first output node and a second output node. The integrated circuit includes a multiple signal format output driver, which includes a differential circuit configured to provide a differential signal to the first output node and the second output node. The multiple signal format output driver includes a load circuit including a first resistor and a second resistor. The load circuit is configurable in response to one or more first values of a control signal to couple the first resistor between the first output node and a regulated voltage node and to couple the second resistor between the second output node and the regulated voltage node. The load circuit is configurable in response to one or more second values of the control signal to couple the first and second output nodes to each other using the first and second resistors. In at least one embodiment of the integrated circuit, the multiple signal format output driver is configurable to provide a current-mode logic (CML) output signal in response to a CML value of one or more first values of the control signal, the multiple signal format output driver is configurable to provide a low-power, low-voltage positive emitter-coupled logic (low-power LVPECL) output signal in response to a low-power LVPECL value of the one or more first values of the control signal, and the multiple signal format output driver is configurable to provide a low-voltage differential signaling (LVDS) output signal in response to an LVDS value of the one or more first values of the control signal. The output driver may be configurable to provide an LVPECL output signal in response to a second value of the control signal. In at least one embodiment of the integrated circuit, the multiple signal format output driver is configurable to provide a high-speed current steering logic (HCSL) output in response to a third value of the control signal.

In at least one embodiment of the invention, a method includes configuring a multiple signal format driver to generate an output signal according to an output standard indicated by a control signal. The configuring includes configuring a load circuit of the multiple signal format driver to have one of a plurality of configurations based on the control signal. The plurality of configurations of the load circuit includes a first configuration and a second configuration. The first configuration includes coupling a first resistor of the load circuit between the first output node and a regulated voltage node and coupling a second resistor of the load circuit between the second output node and the regulated voltage node. The second configuration includes coupling the first and second output nodes to each other using the first and second resistors. The configuring may configure the multiple signal format driver to provide a current-mode logic (CML) output signal in response to a CML value of one or more first values of the control signal. The configuring may configure the multiple signal format driver to provide a low-power, low-voltage positive emitter-coupled logic (low-power LVPECL) output signal in response to a low-power LVPECL value of the one or more first values of the control signal. The configuring may configure the multiple signal format driver to provide a low-voltage differential signaling (LVDS) output signal in response to an LVDS value of the one or more first values of the control signal.

In at least one embodiment of the invention, an integrated circuit includes a pair of output terminals and a multiple signal format output driver configured to provide to the pair of output terminals an output signal having an amplitude and common-mode voltage compliant with an output standard indicated by a control signal. The output standard is selected from a group comprising low-power, low-voltage positive emitter-coupled logic (low-power LVPECL), and at least one of low-voltage differential signaling (LVDS), high-speed current steering logic (HCSL), and low-voltage positive emitter-coupled logic (LVPECL). The group may include current-mode logic (CML).

BRIEF DESCRIPTION OF THE DRAWINGS

The present invention may be better understood, and its numerous objects, features, and advantages made apparent to those skilled in the art by referencing the accompanying drawings.

FIGS. 8.1-8.5 illustrate circuit diagrams of a differential path configured in various modes of operations consistent with at least one embodiment of the present invention.

FIGS. 13.1-13.4 illustrate circuit diagrams of a differential path configured in various modes of operation consistent with at least one embodiment of the present invention.

The use of the same reference symbols in different drawings indicates similar or identical items.

DETAILED DESCRIPTION

Figure 1:
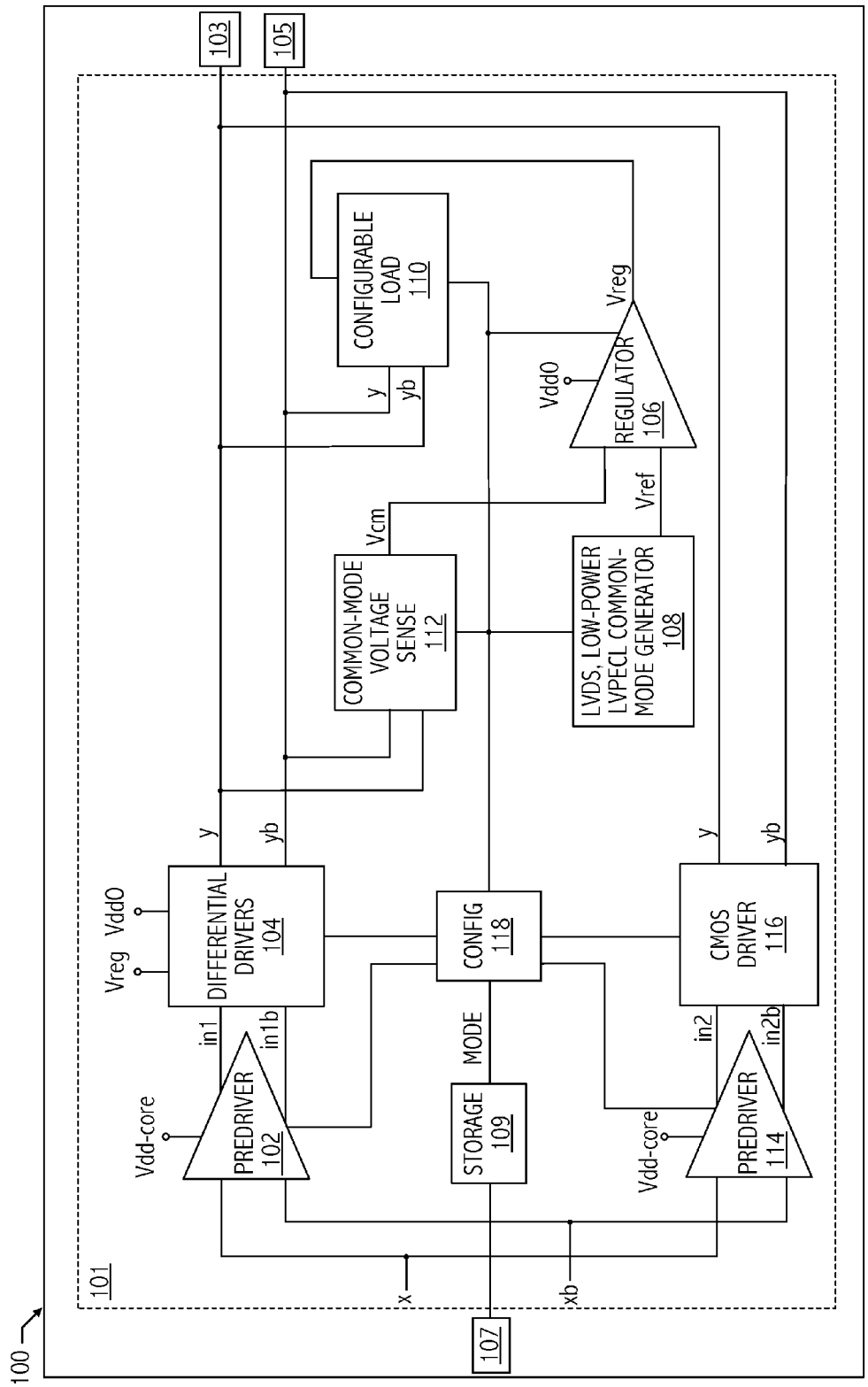
FIG. 1 illustrates a functional block diagram of an integrated circuit including an output driver circuit consistent with at least one embodiment of the present invention.

FIG. 1 illustrates integrated circuit 100 including multiple signal format output driver 101, which may be an output portion of a microprocessor, a clock source integrated circuit, or other integrated circuit product. Output driver 101 receives differential current mode logic level signals x and xb and drives those signals off-chip consistent with a selected output mode configuration, which indicates a selected output format mode, e.g., a CMOS mode or one of a plurality of differential signaling modes. Configuration module 118 configures multiple signal format output driver 101 in either a CMOS mode or one of a plurality of differential output modes based on control signal MODE. Control signal MODE can be a mode indicator stored in storage element 109, which is based on an on-chip signal or received from off-chip via pins, fuses, switches, or other electrical devices on a printed circuit board including integrated circuit 100. In at least one embodiment of integrated circuit 100, the control signal MODE is provided to integrated circuit 100 during packaging. In other embodiments, a user (e.g., application software or hardware on an application printed circuit board) provides control signal MODE to integrated circuit 100.

The CMOS mode is a single-ended mode in which multiple signal format output driver 101 produces a single output signal, although it may be provided off-chip on multiple output pads. In the CMOS mode, control signals configure multiple signal format output driver 101 to drive capacitive loads to CMOS logic levels. In the differential output modes, configuration module 118 configures multiple signal format output driver 101 to produce a differential output consistent with a selected differential output mode and drives the differential signal off-chip using output nodes y and yb and pads 103 and 105. The differential signaling modes may include LVPECL (Low-Voltage Positive Emitter-Coupled Logic), LVDS (Low-Voltage Differential Signaling), low-power LVPECL, CML (Current-Mode Logic), and High-Speed Current Steering Logic (HCSL), which specify particular common-mode voltages and output swing voltages. Typical specifications for these output standards are summarized in Table 1.

TABLE 1

| Mode | Common-Mode Voltage (Vcm(V) – typ) in Volts | Voltage Swing (Vpp-se(V) – typ) in Volts |
| --- | --- | --- |
| CMOS | VddO*0.5 | VddO |
| LVPECL | VddO-1.3 | 0.8 |
| LVDS | 1.2 | 0.35 |
| low-power LVPECL | VddO-1.3 | 0.8 |
| CML | VddO-0.2 | 0.4 |
| HCSL | 0.35 | 0.7 |

A typical LVPECL termination includes resistor combinations that consume power or require use of an additional power supply, e.g., VddO-1.3V, where VddO is the power supply voltage of the output driver. Low-power LVPECL is a signal standard that supports LVPECL voltage level swings with only a 100 Ohm differential termination instead of the typical power-hungry LVPECL termination. Low-power LVPECL eliminates the need for external DC biasing and reduces power consumption without substantially increasing jitter on the output signal. However techniques described herein apply to other combinations of output modes.

Configuration module 118 selectively enables either a CMOS path or a differential path to operate according to the specification for the selected output mode. Configuration module 118 may include a processor, storage elements containing data and/or instructions for execution on the processor, and/or other control circuitry that is used to configure elements of output driver 101 using one or more control signals based on the selected mode of operation for output driver 101. Multiple signal format output driver 101 receives a signal on x and xb that is a differential CML signal based on a first power supply of the integrated circuit, i.e., an on-chip, regulated power supply voltage Vdd_core, e.g., a regulated 1.2 V power supply. Predrivers 102 and 114 are digitally controllable current mode logic drivers that amplify the signal received on x and xb. Note that other input signal formats and corresponding predrivers may be used. Integrated circuit 100 includes bond pads 103 and 105, which are typical conductors that are used to provide connections external to integrated circuit 100.

Figure 2:
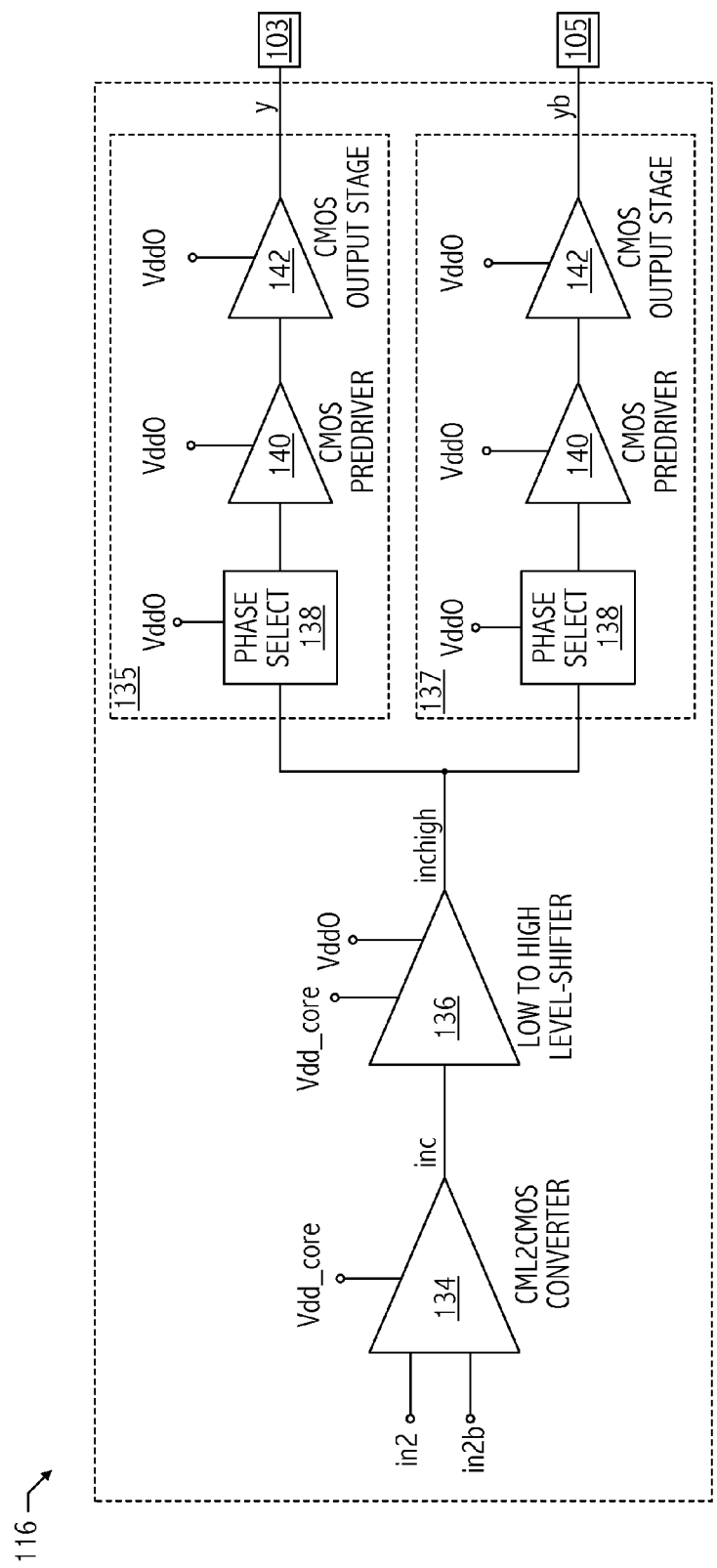
FIG. 2 illustrates a functional block diagram of a CMOS driver of FIG. 1 consistent with at least one embodiment of the present invention.

In a CMOS mode, predriver 102 and the differential path are disabled while predriver 114 and CMOS driver 116 are selectively enabled to produce a CMOS format output signal on y and drive at least one of bond pads 103 and 105. Predriver 114 provides an amplified version of the CML signal to CMOS driver 116 on in2 and in2b. An exemplary CMOS driver 116 is illustrated in FIG. 2. Converter 134 converts the amplified current-mode logic signal received on in2 and in2b to a CMOS signal, inc, which is referenced to Vdd_core. Level-shifter 136 then shifts the voltage level of the CMOS signal from being referenced Vdd_core to being an output voltage referenced signal inchigh that is referenced to a higher voltage power supply, VddO, received from off-chip. The output voltage VddO may be approximately 1.71V≤VddO≤3.63V. Level-shifter 136 provides that high-voltage signal to identical parallel paths that provide the CMOS signal to bond pads 103 and 105. Parallel CMOS paths 135 and 137 coupled to bond pads 103 and 105, respectively, are included to balance the loads on those bond pads. Since in both CMOS mode and differential mode, such embodiments of CMOS driver 116 loads a node coupled to y and may result in unequal loading of bond pads 103 and 105. Each of CMOS paths 135 and 137 provides a half-sized load, introducing an equivalent load at each of the bond pads 103 and 105. Bond pads 103 and 105 may be coupled externally to provide a single output y. Note that in other embodiments of CMOS driver 116, only one of CMOS paths 135 and 137 is included and coupled to a single bond pad, e.g., bond pad 103, and the other bond pad, e.g., bond pad 105, is unused in CMOS mode.

Each of CMOS paths 135 and 137 includes a digitally controllable phase select circuit 138, which is used to produce the signal or its complement with minimum phase delay between the two versions. For example, each phase select circuit 138 of CMOS path 135 and 137 can be digitally controlled to generate in-phase or out-of-phase signals, such that the output signals on pads 103 and 105 are in-phase with each other (i.e., y and y), or 180 degrees out-of-phase with each other (i.e., y and yb, as shown), respectively. Each of CMOS paths 135 and 137 also includes CMOS predrivers 140 (e.g., inverters with disable control) and CMOS output stages 142 (e.g., inverters which are sized to appropriate drive strengths and have disable control).

Figure 3:
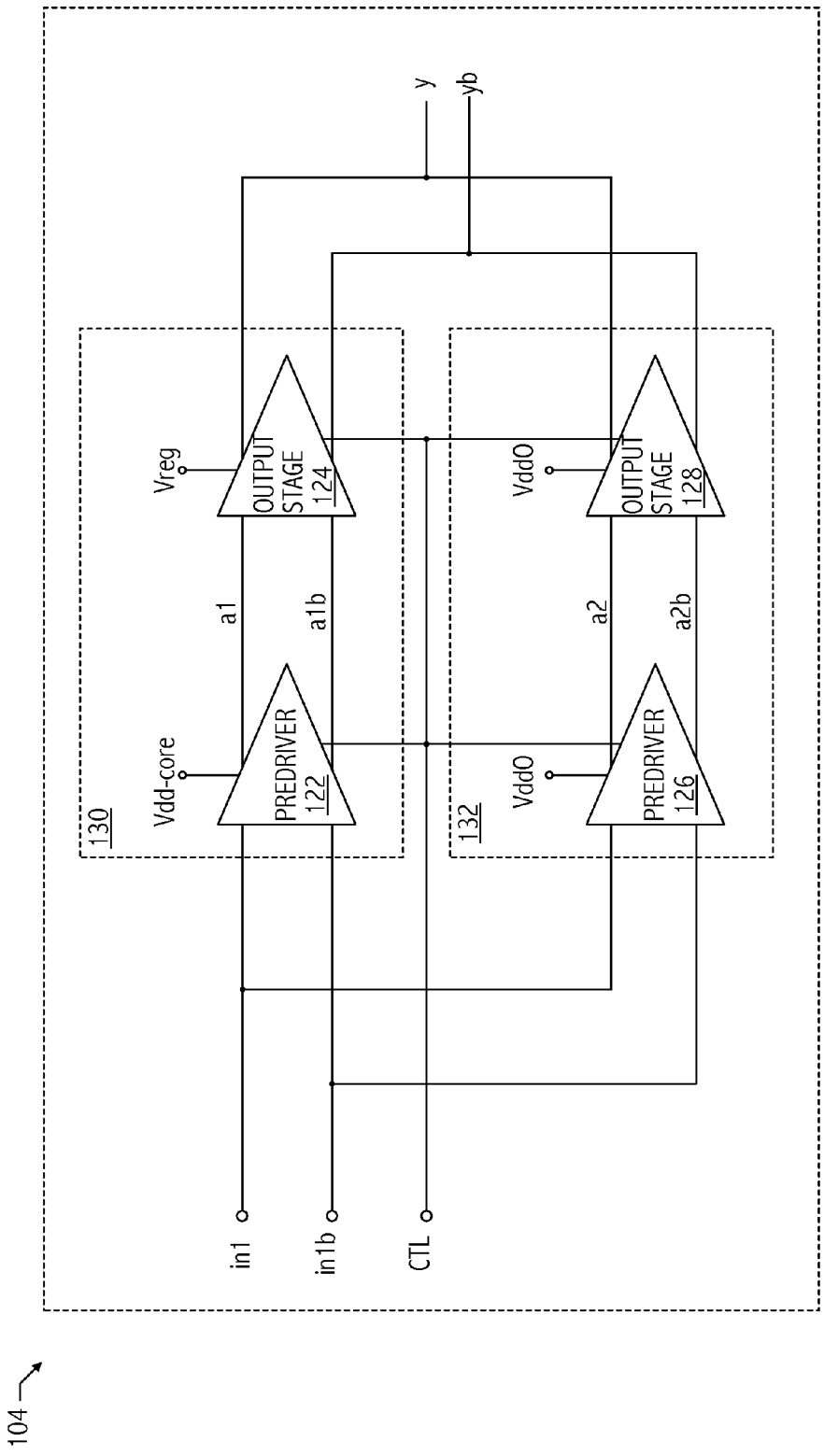
FIG. 3 illustrates a functional block diagram of differential drivers of FIG. 1 consistent with at least one embodiment of the present invention.

Referring back to FIG. 1, when MODE indicates a differential output mode, configuration module 118 disables the CMOS path and configures differential drivers 104, regulator 106, common-mode reference generator 108, common-mode sense circuit 112, and configurable load 110 to support the selected differential output mode indicated by MODE. Referring to FIG. 3, differential drivers 104 includes two parallel differential paths of current mode logic stages, e.g., path 130 and path 132. In general, only one of those two parallel paths is enabled in response to MODE.

If MODE indicates that the selected output mode is HCSL or LVPECL, control signals CTL generated by configuration module 118 enable path 132 and disable path 130. Path 132 includes predriver 126 and output stage 128, both of which are referenced to VddO. In at least one embodiment of path 132, predriver 126 includes an n-type differential pair of input devices and output stage 128 includes external supply referenced, p-type differential pair of input devices. Accordingly, if selectively enabled, path 132 generates output signals that comply with the LVPECL standard or the HCSL standard based on the value of MODE.

Figure 4:
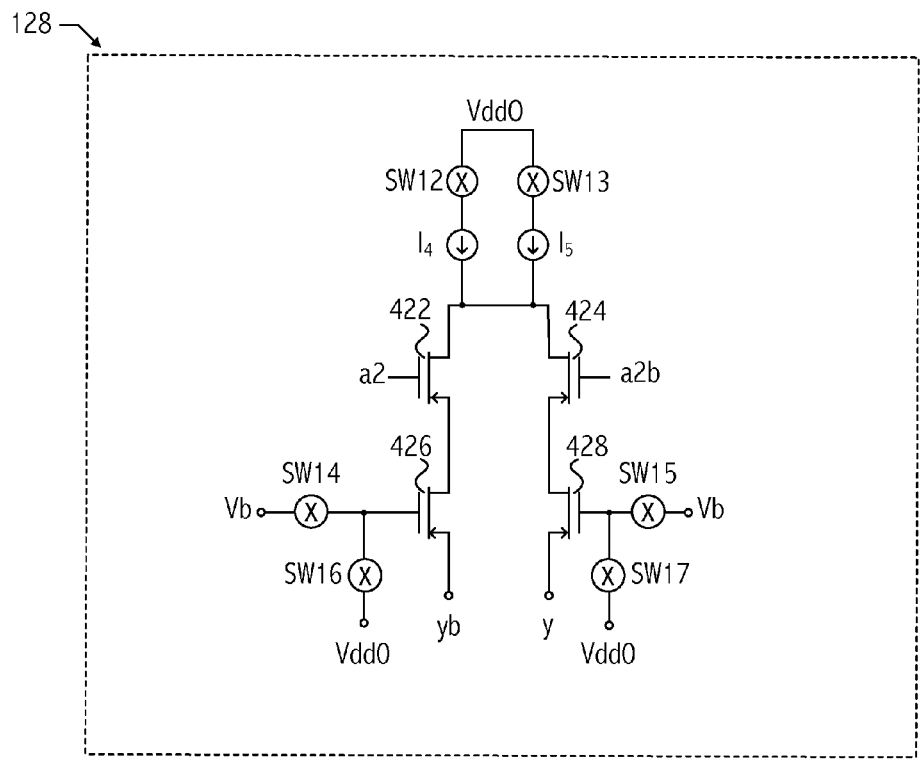
FIG. 4 illustrates a circuit diagram of an output stage of the differential drivers of FIG. 3 consistent with at least one embodiment of the present invention.

Referring to FIG. 4, an exemplary output stage 128 of path 132 includes a p-type differential pair of input devices, devices 422 and 424, which are selectively configurable to be responsive to input signals a2 and a2b. Output stage 128 includes cascode devices 426 and 428 that are selectively enabled if MODE indicates HCSL or LVPECL as the selected output mode. If MODE indicates that the selected output mode is LVPECL, switches SW12 and SW13 are closed and current sources $I_4$ and $I_5$ are active. When MODE indicates that the selected output mode is HCSL, only switch SW12 is closed and only current source $I_4$ is active. In either of the LVPECL and HCSL output modes, switches SW14 and SW15 are closed and switches SW16 and SW17 are open, thereby coupling the gates of cascode devices 426 and 428 to bias voltage Vb. If the output driver is operating in a mode that is unsupported by the output stage 128, switches SW14 and SW15 are open and switches SW16 and SW17 are closed, thereby coupling the gates of cascode devices 426 and 428 to VddO, which turns off those devices and provides a high impedance. Table 2 summarizes the switch settings for output stage 128.

TABLE 2

| Mode | SW12 | SW13 | SW14/15 | SW16/17 |
|---|---|---|---|---|
| CMOS | open | open | open | closed |
| LVDS | open | open | open | closed |
| low-power LVPECL | open | open | open | closed |
| CML | open | open | open | closed |
| LVPECL | closed | closed | closed | open |
| HCSL | closed | open | closed | open |
| Other (unsupp by 128) | open | open | open | closed |

Referring back to FIG. 1, when MODE indicates that the selected output mode is LVDS, low-power LVPECL, or CML, control signals enable path 130. Path 130 includes predriver 122, which generates signals having levels referenced to Vdd_core, and output stage 124, which generates signals having levels based on VddO or a regulated version of VddO (Vreg). In at least one embodiment of path 130, predriver 122 and output stage 124 include a ground-referenced n-type differential pair of input devices.

Figure 5:
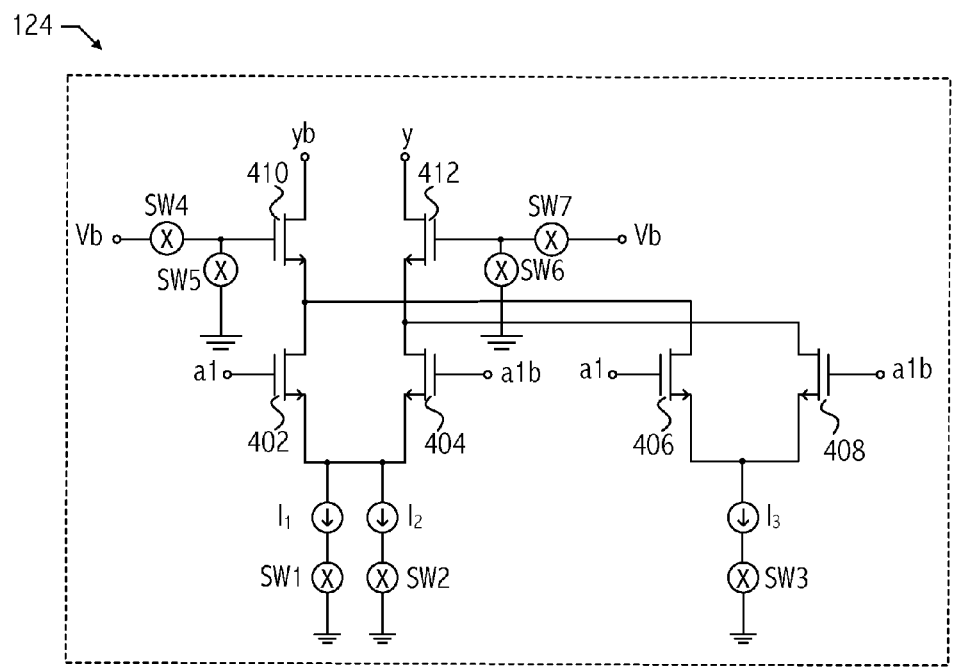
FIG. 5 illustrates a circuit diagram of an output stage of the differential drivers of FIG. 3 consistent with at least one embodiment of the present invention.

Referring to FIG. 5, an exemplary output stage 124 of path 130 includes n-type differential pairs of input devices, devices 402 and 404 and devices 406 and 408, that are selectively configurable to be responsive to input signals a1 and a1b. If MODE indicates that the selected output mode is LVDS, control signals close switch SW1 and only current source $I_1$ is active. If MODE indicates that the selected output mode is CML, control signals close switches SW1 and SW2 and only current sources $I_1$ and $I_2$ are active. If MODE indicates that the selected output mode is low-power LVPECL mode, control signals close all three switches SW1, SW2, and SW3, both of the differential pairs of input devices are enabled and all three current sources $I_1$, $I_2$ and h are active. If MODE indicates that the selected output mode is CML, LVDS, or low power LVPECL, control signals close switches SW4 and SW7 and open switches SW5 and SW6, thereby coupling the gates of cascode devices 410 and 412 to bias voltage Vb. If the output driver is operating in a mode that is unsupported by the output stage 124, control signals open switches SW4 and SW7 and close switches SW5 and SW6, thereby coupling the gates of cascode devices 410 and 412 to ground, which turns off those devices and provides a high impedance. Table 3 summarizes the switch settings of output stage 124.

TABLE 3

| Mode | SW1 | SW2 | SW3 | SW4/7 | SW5/6 |
|---|---|---|---|---|---|
| CMOS | open | open | open | open | closed |
| LVDS | closed | open | open | closed | open |
| low-power LVPECL | closed | closed | closed | closed | open |
| CML | closed | closed | open | closed | open |
| LVPECL | open | open | open | open | closed |
| HCSL | open | open | open | open | closed |
| Other (unsupp by 124) | open | open | open | open | closed |

Figure 6:
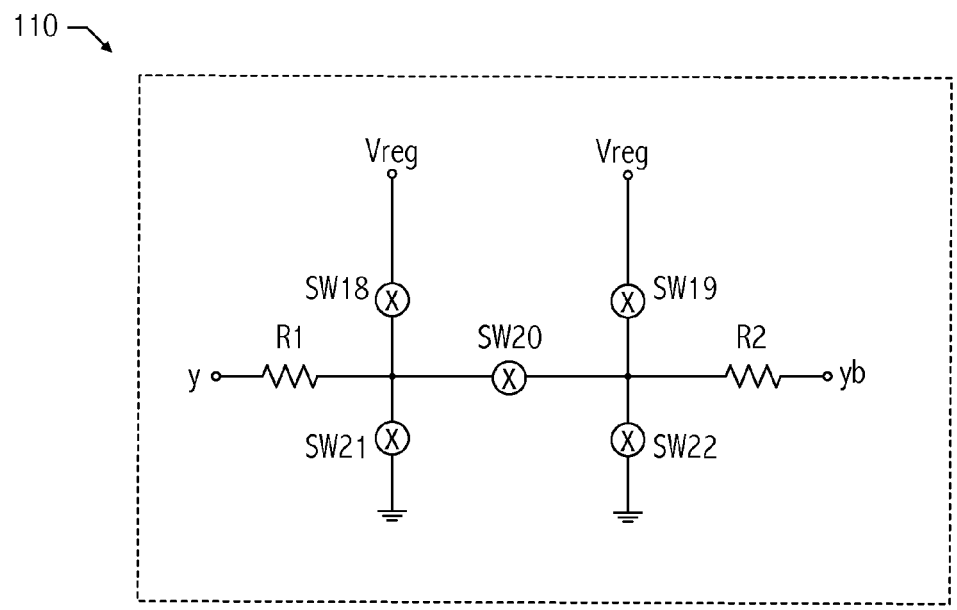
FIG. 6 illustrates a circuit diagram of a configurable load circuit of FIG. 1 consistent with at least one embodiment of the present invention.

Referring back to FIG. 1, the differential output node y and yb is coupled to configurable load 110, which is a load circuit that is included internally on integrated circuit 100 and is selectively configured for both ground-referenced and supply voltage-referenced output formats. For example, resistive load circuit 110 of FIG. 6 uses switches SW18, SW19, SW20, SW21 and SW22 to load the output nodes y and yb using load resistors R1 and R2 according to the selected output mode. In LVPECL mode, load resistors R1 and R2 are coupled to each other. In LVDS mode, low-power LVPECL mode, and CML mode, load resistors R1 and R2 are coupled to the output of voltage regulator 106, Vreg. In HCSL mode, load resistors R1 and R2 are coupled to ground. Table 4 summarizes the switch positions of switches SW18, SW19, SW20, SW21 and SW22 in configurable load 110 for the various output modes.

TABLE 4

| Mode | SW18 | SW19 | SW20 | SW21 | SW22 |
|---|---|---|---|---|---|
| CMOS | open | open | open | open | open |
| LVDS | closed | closed | open | open | open |
| low-power LVPECL | closed | closed | open | open | open |
| CML | closed | closed | open | open | open |
| LVPECL | open | open | closed | open | open |
| HCSL | open | open | open | closed | closed |
| Other (unsupp by 110) | open | open | open | open | open |

Since switches SW18, SW19, SW20, SW21 and SW22 must carry a relatively large amount of current and provide minimum voltage drop, switches SW18, SW19, SW20, SW21 and SW22 are relatively large devices that introduce a minimum resistance to the current path. However, since large devices can add a relatively large amount of parasitic capacitance, they are not directly in the signal path, i.e., they are positioned to reduce or eliminate the effect they may have on output nodes y and yb. This ensures that this multiple signal format output driver can operate up to very high frequencies with little or no degradation in performance. However, note that other embodiments of configurable load circuit 110 can include switches that configure R1 and R2 in other locations consistent with the output mode formats described herein.

If the target output mode is LVDS, low-power LVPECL, or CML, configurable load circuit 110 couples y1 and y1b to Vreg through resistors R1 and R2. Referring back to FIG. 1, voltage regulator 106 provides the voltage level Vreg to resistors R1 and R2 of configurable load 110. Voltage regulator 106 receives VddO from off-chip and maintains a constant voltage level using conventional techniques. However, in LVDS and low-power LVPECL modes, voltage regulator 106 maintains that constant voltage level using common-mode feedback techniques. For example, common-mode voltage sense circuit 112 is used to sense Vcm and common-mode reference voltage generator 108 is used to generate a target common-mode voltage, Vref. The reference voltage, Vref, may be based on a predetermined indicator using any suitable technique. Common-mode regulator 106 compares the Vref output of common-mode reference voltage generator 108 and common-mode voltage generator Vcm output of common-mode voltage sense circuit 112 and adjusts Vreg to reduce the common-mode error. This feedback loop ensures that the output common-mode voltage of the differential path meets the specifications of the selected output signal format. Common-mode reference generator 108 provides regulated voltages according to the selected standard. Typically, the regulated voltages are generated by a controlled current flowing through a resistor, but any suitable technique for generating regulated voltages may be used. In CML mode, configuration module 118 configures regulator 106 to provide VddO as Vreg, e.g., by coupling VddO to the output node of regulator 106. Note that for LVPECL, CML, and HCSL signaling formats, the internal load with switches is configured in such a way that the combination of current that is driven into the output node, in addition to the internal load resistor value and external termination for the signaling format concerned, sets the common mode and output voltage swing of the signal on y and yb without the need for common-mode feedback. This saves valuable die area and power.

Figure 7:
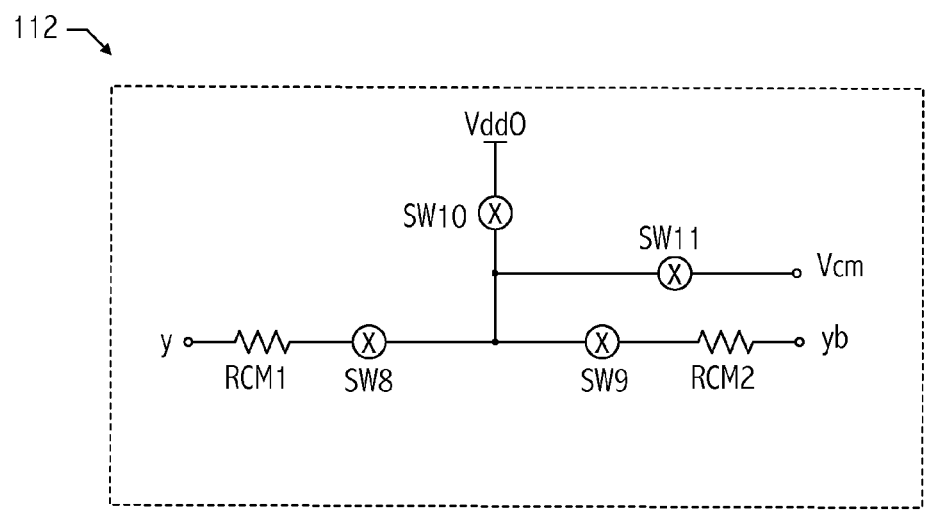
FIG. 7 illustrates a circuit diagram of a common-mode voltage generator circuit of FIG. 1 consistent with at least one embodiment of the present invention.

Referring to FIG. 7, an exemplary common-mode source circuit 112 includes two equal-valued sensing resistors RCM1 and RCM2 selectively coupled to the output nodes y and yb, respectively. Switches SW8, SW9, SW10 and SW11 selectively couple sensing resistors RCM1 and RCM2 to generate common-mode voltage Vcm only in modes that use common-mode sensing (e.g., LVDS and low-power LVPECL). When common-mode sensing is used, switches SW8, SW9 and SW11 are closed and SW10 is open and common-mode circuit 108 performs an averaging function on the voltages on y and yb, i.e., Vcm=(Vy+Vyb)/2. When common-mode sensing is inactive, switches SW8, SW9 and SW11 are open and switch SW10 is closed to protect devices in switches SW8 and SW9 by coupling them to VddO. Configurations of the switches for various output modes are summarized in Table 5.

TABLE 5

| Mode | SW8/9/11 | SW10 |
|---|---|---|
| CMOS | open | closed |
| LVDS | closed | open |
| low-power LVPECL | closed | open |
| CML | open | closed |
| LVPECL | open | closed |
| HCSL | open | closed |
| Other (unsupp by 112) | open | closed |

The effective differential paths coupled to the output nodes y and yb in various modes are illustrated in FIGS. 8.1, 8.2, 8.3, 8.4, and 8.5 for output modes LVDS, CML, low-power LVPECL, LVPECL and HCSL, respectively. These figures illustrate only enabled circuitry of output stage 124, output stage 128, configurable load 110, common-mode source circuit 112. For ease of illustration, associated switches devices and inactive circuitry are excluded.

Figure 9:
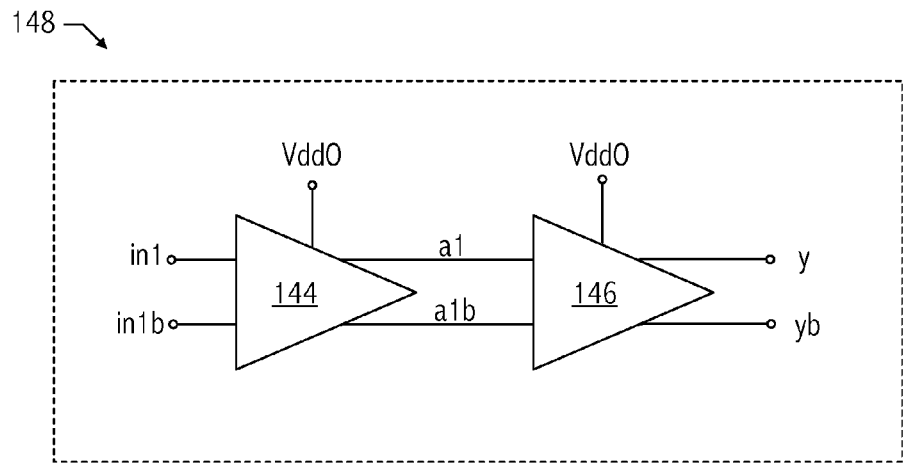
FIG. 9 illustrates a functional block diagram of a variation of the differential drivers of FIG. 1 consistent with at least one embodiment of the present invention.
Figure 10:
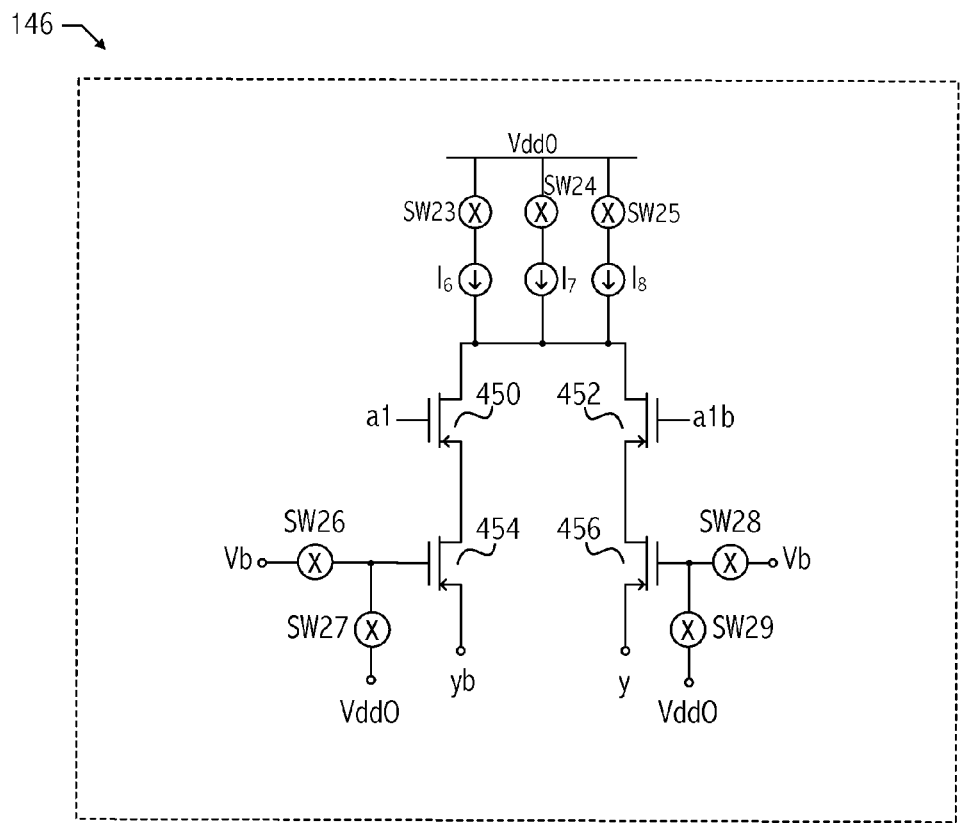
FIG. 10 illustrates a functional block diagram of an output stage of FIG. 9 consistent with at least one embodiment of the present invention.

In at least one embodiment of multiple signal format output driver 101, CML is not supported and a multiple signal format output driver 101 that supports CMOS, LVDS, low-power LVPECL, LVPECL, and HCSL includes a simplified differential path. For example, referring back to FIG. 1, differential drivers 104, which include two differential driver paths, can be replaced by differential drivers 148 of FIG. 9. Differential drivers 148 include a single differential path that includes predriver 144 and output stage 146, both of which receive VddO. An exemplary output stage 146 of FIG. 10 includes a p-type differential pair of input devices, devices 450 and 452, that are selectively configurable to be responsive to input signals a1 and a1b. Output stage 146 includes cascode devices 454 and 456 that are selectively enabled in LVDS, low-power LVPECL, or HCLS modes. When MODE indicates that the selected output mode is LVDS, control signals close switches SW23, SW26, and SW28, thereby activating current source $I_6$ and coupling the gates of cascode devices 454 and 456 to bias voltage Vb. If MODE indicates that the selected output mode is HCSL, control signals close switches SW23, SW24, SW26, and SW28, thereby activating current sources $I_6$ and $I_7$ and connecting the gates of cascode devices 454 and 456 to bias voltage Vb. In either of LVPECL and low-power LVPECL modes, switches SW23, SW24, SW25, SW26, and SW28 are closed, thereby activating current sources $I_6$, $I_7$, and $I_8$ and connecting the gates of cascode devices 454 and 456 to bias voltage Vb. If the output driver is operating in a mode that is unsupported by the output stage 146, control signals open switches SW26 and SW28 and close switches SW27 and SW29, thereby coupling the gates of cascode devices 454 and 456 to VddO, which turns off those devices and provides a high impedance. Table 6 summarizes the switch settings of output stage 146.

TABLE 6

| Mode | SW23 | SW24 | SW25 | SW26/28 | SW27/29 |
|---|---|---|---|---|---|
| CMOS | open | open | open | open | closed |
| LVDS | closed | open | open | closed | open |
| low-power LVPECL | closed | closed | closed | closed | open |
| LVPECL | closed | closed | closed | closed | open |
| HCSL | closed | closed | open | closed | open |
| Other (unsupp by 146) | open | open | open | open | closed |

Figure 11:
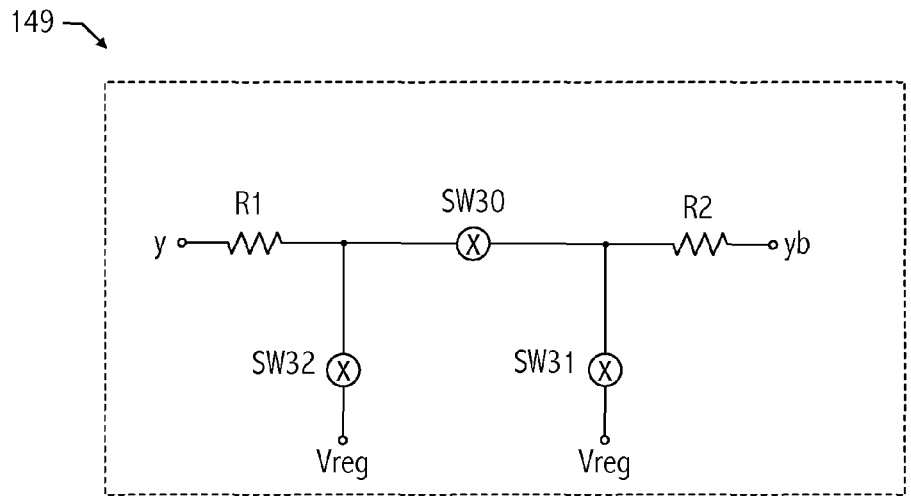
FIG. 11 illustrates a circuit diagram of a variation of a configurable load circuit consistent with at least one embodiment of the present invention.
Figure 12:
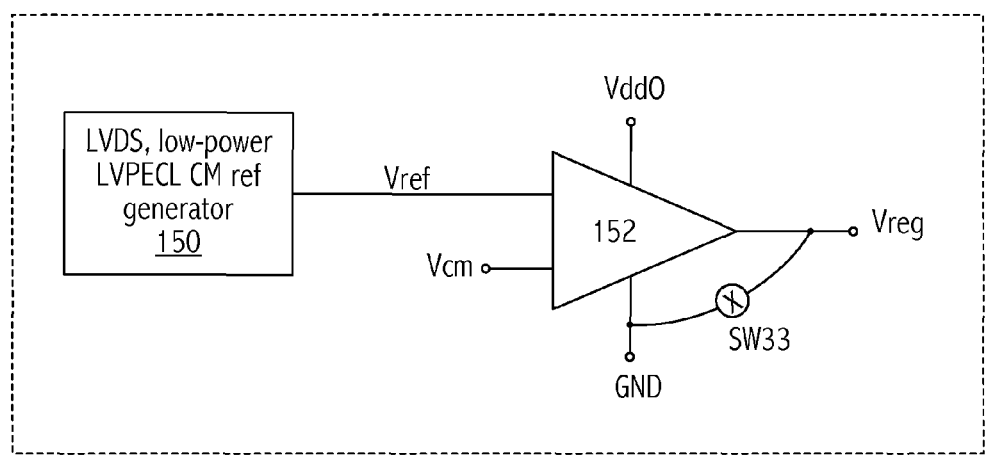
FIG. 12 illustrates a functional block diagram of a variation of common-mode feedback circuitry consistent with at least one embodiment of the present invention.

Referring back to FIG. 1, in a configuration that does not support CML, output driver 101 can include a simplified configurable load. For example, configurable load 110 can be replaced by configurable load 149 of FIG. 11 and regulator 106 and common-mode reference generator 108 can be replaced by common-mode reference generator 150 and regulator 152 of FIG. 12. The differential output node y and yb of FIG. 1 is coupled to configurable load 149 of FIG. 11, which is a load circuit that is included internal to integrated circuit 100 and selectively configured for both ground-referenced and supply voltage-referenced output formats. For example, load circuit 149 uses switches SW30, SW31, and SW32 to load the output nodes y and yb with load resistors R1 and R2 according to the selected output mode. In LVPECL mode, load resistors R1 and R2 are coupled to each other. In LVDS, low-power LVPECL, and HCSL modes, load resistors R1 and R2 are coupled to the output voltage Vreg provided by voltage regulator 106. Table 7 summarizes the switch positions of switches SW30, SW31, and SW32 for the various output modes.

TABLE 7

| Mode | SW30 | SW31/32 |
|---|---|---|
| CMOS | open | open |
| LVDS | open | closed |
| low-power LVPECL | open | closed |
| LVPECL | closed | open |
| HCSL | open | closed |
| Other (unsupp by 146) | open | open |

In LVDS, low-power LVPECL, and HCSL, configurable load circuit 149 couples y and yb to Vreg through resistors R1 and R2. However, LVDS and low-power LVPECL use common-mode feedback through the generation of the regulated voltage Vreg, which is the reference voltage for output stage 146. In the LVPECL mode, control signals disable common-mode reference generator 150 and the common-mode feedback of regulator 152 of FIG. 12. The HCSL mode disables common-mode reference generator 150 and regulator 152 of FIG. 12. In addition, the HCSL mode couples Vreg to ground via switch SW33 to provide a ground-referenced output stage. In at least one embodiment of regulator 152, the function of SW33 is included internally in regulator 152, which may reduce area.

Since switches SW30, SW31, and SW32 must carry a large amount of current and provide minimum voltage drop, switches SW30, SW31, and SW32 are relatively large devices that introduce a minimum resistance to the current path. However, since large devices can add a relatively large amount of parasitic capacitance, they are not located directly in the signal path, i.e., they are positioned to reduce or eliminate any effect they may have on the charge/discharge times of the output nodes y and yb. This ensures that this multiple signal format output driver can operate up to very high frequencies with little or no degradation in performance. However, note that other embodiments of configurable load circuit 149 can include switches that configure R1 and R2 in other locations consistent with the output mode formats described herein.

The effective circuitry coupled to the output nodes y and yb in various modes of output stage 146, configurable load 149, common-mode sense circuit 112, and regulator 152 are illustrated in FIGS. 13.1, 13.2, 13.3, and 13.4 for output modes LVDS, HCSL, low-power LVPECL, and LVPECL, respectively. These figures illustrate only enabled circuitry. For ease of illustration, the associated switch devices and inactive circuitry are excluded.

Note that for the embodiments of multiple signal format output driver 101 described with reference to FIGS. 9-12, LVPECL, and HCSL signaling formats common-mode feedback is not required because the internal load with switches is configured in such a way that the combination of current that is driven into the output node in addition to the internal load resistor value and external termination for the signaling format concerned sets the common-mode and output voltage swing without the need for common-mode feedback.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which particular signal standards are used, one of skill in the art will appreciate that the teachings herein can be utilized with other signal standards. Variations and modifications of the embodiments disclosed herein may be made based on the description set forth herein, without departing from the scope and spirit of the invention as set forth in the following claims.

What is claimed is:

1. An integrated circuit comprising:
a first output node;
a second output node; and
a multiple signal format output driver comprising:
   a differential circuit configured to provide a differential signal to the first output node and the second output node; and
   a load circuit comprising
      a first resistor and a second resistor;
      a first switch coupled to the first resistor and a regulated voltage node;
      a second switch coupled to the second resistor and the regulated voltage node; and
      a third switch coupled to the first resistor, the second resistor, the first switch, and the second switch, the load circuit being configurable in response to one or more first values of a control signal to couple the first resistor between the first output node and the regulated voltage node and to couple the second resistor between the second output node and the regulated voltage node, the load circuit being configurable in response to one or more second values of the control signal to couple the first resistor between the first output node and the third switch and to couple the second resistor between the second output node and the third switch.

2. The integrated circuit, as recited in claim 1, wherein the multiple signal format output driver is configurable to provide a current-mode logic (CML) output signal in response to a CML value of one or more first values of the control signal, the multiple signal format output driver is configurable to provide a low-power, low-voltage positive emitter-coupled logic (low-power LVPECL) output signal in response to a low-power LVPECL value of the one or more first values of the control signal, and the multiple signal format output driver is configurable to provide a low-voltage differential signaling (LVDS) output signal in response to an LVDS value of the one or more first values of the control signal.

3. The integrated circuit, as recited in claim 1, wherein the multiple signal format output driver is configurable to provide a low-voltage positive emitter-coupled logic (LVPECL) output signal in response to a second value of the control signal.

4. The integrated circuit, as recited in claim 3, wherein the load circuit is further configurable in response to a third value of the control signal to couple the first resistor between the first output node and ground and to couple the second resistor between the second output node and ground.

5. The integrated circuit, as recited in claim 1, wherein the multiple signal format output driver is configurable to provide a high-speed current steering logic (HCSL) output in response to a second value of the control signal.

6. The integrated circuit, as recited in claim 1, wherein the differential circuit comprises:
a first differential circuit comprising a ground-referenced differential pair of devices, the first differential circuit being configured to provide the differential signal to the first output node and the second output node in response to the one or more first values of the control signal and disabled in response to other values of the control signal; and
a second differential circuit comprising an external supply voltage-referenced differential pair of devices, the second differential circuit being configured to provide the differential signal to the first output node and the second output node in response to the one or more second values of the control signal and disabled in response to other values of the control signal.

7. The integrated circuit, as recited in claim 1, further comprising:
a first bond pad coupled to the first output node; and
a second bond pad coupled to the second output node.

8. The integrated circuit, as recited in claim 1, further comprising:
a common-mode feedback circuit selectively operable in response to the control signal to generate a feedback common-mode voltage signal; and
a voltage regulator configured to adjust a voltage level provided to the regulated voltage node, the adjusting being based on the feedback common-mode voltage signal and a reference voltage level.

9. The integrated circuit, as recited in claim 1, wherein the load circuit further comprises:

a fourth switch coupled to the first switch, first resistor, the third switch, and a ground power supply node; and
a fifth switch coupled to the second switch, second resistor, the third switch, and a ground power supply node.

10. An integrated circuit comprising:
a first output node;
a second output node; and
a multiple signal format output driver comprising:
a differential circuit configured to provide a differential signal to the first output node and the second output node; and
a load circuit comprising a first resistor and a second resistor, the load circuit being configurable in response to one or more first values of a control signal to couple the first resistor between the first output node and a regulated voltage node and to couple the second resistor between the second output node and the regulated voltage node, the load circuit being configurable in response to one or more second values of the control signal to couple the first resistor between the first output node and another node and to couple the second resistor between the second output node and the other node,
wherein the multiple signal format output driver is configurable to provide a high-speed current steering logic (HCSL) output in response to a second value of the control signal,
wherein the differential circuit is disabled in response to a fourth value of the control signal.

11. The integrated circuit, as recited in claim 10, further comprising:
an additional differential circuit configured to provide an output to the first and second nodes in response to the fourth value of the control signal and disabled otherwise.

12. The integrated circuit, as recited in claim 10, wherein the load circuit further comprises:
a first switch coupled to the first resistor and the regulated voltage node;
a second switch coupled to the second resistor and the regulated voltage node; and
a third switch coupled to the first resistor, the second resistor, the first switch, and the second switch.

13. The integrated circuit, as recited in claim 12, wherein the load circuit further comprises:
a fourth switch coupled to the first switch, first resistor, the third switch, and a ground power supply node; and
a fifth switch coupled to the second switch, second resistor, the third switch, and a ground power supply node.

14. The integrated circuit, as recited in claim 10, wherein the multiple signal format output driver is configurable to provide a current-mode logic (CML) output signal in response to a CML value of one or more first values of the control signal, the multiple signal format output driver is configurable to provide a low-power, low-voltage positive emitter-coupled logic (low-power LVPECL) output signal in response to a low-power LVPECL value of the one or more first values of the control signal, and the multiple signal format output driver is configurable to provide a low-voltage differential signaling (LVDS) output signal in response to an LVDS value of the one or more first values of the control signal.

15. The integrated circuit, as recited in claim 10, wherein the multiple signal format output driver is configurable to provide a low-voltage positive emitter-coupled logic (LVPECL) output signal in response to a second value of the control signal.

16. The integrated circuit, as recited in claim 15, wherein the load circuit is further configurable in response to a third value of the control signal to couple the first resistor between the first output node and ground and to couple the second resistor between the second output node and ground.

17. The integrated circuit, as recited in claim 10, further comprising:
- a common-mode feedback circuit selectively operable in response to the control signal to generate a feedback common-mode voltage signal; and
- a voltage regulator configured to adjust a voltage level provided to the regulated voltage node, the adjusting being based on the feedback common-mode voltage signal and a reference voltage level.

18. An integrated circuit comprising:
a first output node;
a second output node; and
a multiple signal format output driver comprising:
- a differential circuit configured to provide a differential signal to the first output node and the second output node; and
- a load circuit comprising a first resistor and a second resistor, the load circuit being configurable in response to one or more first values of a control signal to couple the first resistor between the first output node and a regulated voltage node and to couple the second resistor between the second output node and the regulated voltage node, the load circuit being configurable in response to one or more second values of the control signal to couple the first resistor between the first output node and another node and to couple the second resistor between the second output node and the other node, wherein the differential circuit comprises:
- a first differential circuit comprising a ground-referenced differential pair of devices, the first differential circuit being configured to provide the differential signal to the first output node and the second output node in response to the one or more first values of the control signal and disabled in response to other values of the control signal; and
- a second differential circuit comprising an external supply voltage-referenced differential pair of devices, the second differential circuit being configured to provide the differential signal to the first output node and the second output node in response to the one or more second values of the control signal and disabled in response to other values of the control signal, wherein the first differential circuit comprises devices of a first type responsive to the input signal and the second differential circuit comprises devices of a second type responsive to the input signal, the first and second types being different.

19. The integrated circuit, as recited in claim 18, wherein the multiple signal format output driver is configurable to provide a current-mode logic (CML) output signal in response to a CML value of one or more first values of the control signal, the multiple signal format output driver is configurable to provide a low-power, low-voltage positive emitter-coupled logic (low-power LVPECL) output signal in response to a low-power LVPECL value of the one or more first values of the control signal, and the multiple signal format output driver is configurable to provide a low-voltage differential signaling (LVDS) output signal in response to an LVDS value of the one or more first values of the control signal.

20. The integrated circuit, as recited in claim 18, wherein the multiple signal format output driver is configurable to provide a low-voltage positive emitter-coupled logic (LVPECL) output signal in response to a second value of the control signal.

21. The integrated circuit, as recited in claim 20, wherein the load circuit is further configurable in response to a third value of the control signal to couple the first resistor between the first output node and ground and to couple the second resistor between the second output node and ground.

22. The integrated circuit, as recited in claim 18, wherein the multiple signal format output driver is configurable to provide a high-speed current steering logic (HCSL) output in response to a second value of the control signal.

* * * * *